(12) United States Patent
Smith

(10) Patent No.: US 7,577,784 B1
(45) Date of Patent: Aug. 18, 2009

(54) FULL-TERNARY CONTENT ADDRESSABLE MEMORY (CAM) CONFIGURABLE FOR PSEUDO-TERNARY OPERATION

(75) Inventor: Scott Smith, San Jose, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 153 days.

(21) Appl. No.: 11/011,464

(22) Filed: Dec. 13, 2004

Related U.S. Application Data

(60) Provisional application No. 60/532,401, filed on Dec. 24, 2003.

(51) Int. Cl.
*G06F 12/00* (2006.01)
*G06F 13/00* (2006.01)
*G06F 13/28* (2006.01)
*G11C 15/00* (2006.01)
*G11C 15/04* (2006.01)

(52) U.S. Cl. ........................ 711/108; 365/49.1
(58) Field of Classification Search .................. 711/108
See application file for complete search history.

(56) References Cited

U.S. PATENT DOCUMENTS

| | | | | |
|---|---|---|---|---|
| 4,996,666 A * | 2/1991 | Duluk, Jr. | .................. | 365/49.1 |
| 5,920,886 A | 7/1999 | Feldmeier | .................. | 711/108 |
| 5,959,929 A * | 9/1999 | Cowles et al. | .......... | 365/230.03 |
| 6,134,135 A * | 10/2000 | Andersson | .................... | 365/49 |
| 6,240,485 B1 | 5/2001 | Srinivasan et al. | .......... | 711/108 |
| 6,389,506 B1 | 5/2002 | Ross et al. | | |
| 6,502,163 B1 * | 12/2002 | Ramankutty | ................. | 711/108 |
| 6,549,442 B1 * | 4/2003 | Lu et al. | ...................... | 711/108 |
| 6,606,040 B2 | 8/2003 | Abdat | .......................... | 341/87 |
| 6,697,275 B1 | 2/2004 | Sywyk et al. | | |
| 6,697,276 B1 | 2/2004 | Pereira et al. | .................. | 365/49 |
| 6,738,862 B1 | 5/2004 | Ross et al. | | |
| 6,772,279 B1 | 8/2004 | Sun et al. | | |
| 7,002,823 B1 | 2/2006 | Ichiriu | | |
| 7,111,123 B1 * | 9/2006 | Zou | ........................... | 711/118 |
| 7,120,731 B1 * | 10/2006 | Bhugra et al. | ................ | 711/108 |
| 2004/0022082 A1 | 2/2004 | Khanna | ........................ | 365/49 |
| 2004/0117571 A1 * | 6/2004 | Chang et al. | ................. | 711/162 |
| 2004/0260868 A1 * | 12/2004 | Sit et al. | ...................... | 711/108 |

OTHER PUBLICATIONS

Formal verification of content addressable memories using symbolic trajectory evaluation pp. 167-172 Year of Publication: 1997 ISBN:0-89791-920-3 Manish Pandey et al.*
U.S. Appl. No. 10/165,560, James et al.
U.S. Appl. No. 10/202,526, Zou, Janet.
U.S. Appl. No. 10/286,198, James et al.
U.S. Appl. No. 11/000,568, Smith, Scott.
U.S. Appl. No. 11/047,793, Gupta et al.
U.S. Appl. No. 60/629,694, Jiang, Bin.
Notice of Allowance for U.S. Appl. No. 10/883,160, dated Apr. 13, 2009, for Applicant Bindignivale S. Nataraj.

* cited by examiner

*Primary Examiner*—Sanjiv Shah
*Assistant Examiner*—Marwan Ayash
(74) *Attorney, Agent, or Firm*—Haverstock & Owens, LLP

(57) ABSTRACT

A ternary content addressable memory (TCAM) system and method of operating the same can enable a user to configure the system to operate as either a pseudo TCAM or full TCAM system. Control logic (206) can have an address modification circuit (250) coupled between multiple inputs and row decoders (206-0 and 206-1) for simultaneously writing the same mask value to mask fields of a predetermined number of memory locations in a full TCAM array.

17 Claims, 9 Drawing Sheets

FULL-TERNARY CONTENT ADDRESSABLE MEMORY (CAM) CONFIGURABLE FOR PSEUDO-TERNARY OPERATION

This application claims the benefit of U.S. provisional patent application Ser. No. 60/532,401, filed Dec. 24, 2003.

TECHNICAL FIELD

The present invention relates generally to content addressable memories (CAMs), and more particularly to CAMs that provide pseudo-ternary CAM (PTCAM) operation and method for the same.

BACKGROUND OF THE INVENTION

Content addressable memories (CAMs) can provide rapid matching between a specific pattern of received data bits, commonly known as a search key or comparand, and data values stored in an associative CAM memory array. CAMs can provide advantageous matching speeds as entries (or locations) of an entire CAM array can be searched in parallel. In a CAM, if a match occurs for every bit in a location with every corresponding bit in the comparand, a match flag can be asserted to let a user know that data in the comparand was found in memory. In addition, a value corresponding to the match can be returned. Thus, the result is determined from finding a matching value (content), and not from providing the address of the value as done for a random access memory (RAM.).

One particularly useful type of CAM is a ternary (or tertiary) CAM (or TCAM). A TCAM can include two types of entries: mask and data. A mask entry can indicate which bits in a corresponding data entry take part in a compare/search operation. For example, a mask bit=1 can indicate that the bit in the corresponding data entry can be compared against the corresponding bit in the compare data. In contrast, a mask bit=0 can indicate that the corresponding data entry bit is not compared and is always assumed to evaluate to be matched. Thus, a masked bit will not generate a mismatch indication even if the masked data value bit is different than the corresponding comparand value bit. The logical operation for a ternary CAM, on a bit-by-bit basis, can be represented by the logic:

Match[x]=(Compare[x]==Data[x])|~Mask[x].

The preceding description is that of a "full" TCAM device or system. Such a system typically includes a full TCAM array in which each separate memory location includes a mask and a data field.

A block diagram of a conventional full TCAM is shown in FIG. 10, and designated by the general reference character 1000. In a full Ternary CAM, one mask can control a match (i.e., search) operation on one associated data value. Thus, the full TCAM 1000 includes data entries 1002 with corresponding mask entries 1004. That is, mask entry "Mask=A" can mask match operations for data entry "Data=0", mask entry "Mask=B" can mask match operations for data entry "Data=1", etc. It is understood that each such data/mask entry pair can be accessed at a unique address according to control logic. One such arrangement is shown in FIG. 11.

FIG. 11 is a block diagram showing a conventional write-to-mask operation of a conventional full TCAM. FIG. 11 shows two mask locations 1104-0 and 1104-1 (corresponding data locations being excluded to avoid cluttering the view) as well as the corresponding control logic 1106 for such locations. Control logic 1106 can include row decoders 1106-0 and 1106-1. As shown in the figure, each row decoder (1106-0 and 1106-1) can operate according to a unique row address.

In a conventional write-to-mask operation, a unique row address (ADR) 1108 can be provided to row decoders (1106-0 and 1106-1). In addition, mask write data 1110 can be applied via bit lines 1112 corresponding to the mask locations (1104-0 and 1104-1). When the unique address 1108 corresponds to that of a row decoder (1106-0 and 1106-1), the corresponding row decoder can activate a mask word line, resulting in the write data on bit lines 1112 being written into the corresponding mask location.

Although more flexible, because each memory location includes both mask and data fields, the size and corresponding cost of a full TCAM system can be relatively high, particularly for larger memory capacities.

To reduce the size of a TCAM system or device, it is often desirable to map-mask-to-data entries in the form of a 1:N mapping. That is, in a full TCAM arrangement, mask-to-data mapping is of the form 1:1. To reduce overall size of a TCAM, mask-to-data mapping can be 1:N, where N>1. Such an arrangement is considered a "pseudo" TCAM.

One example of a pseudo TCAM is shown in FIG. 12, and designated by the general reference character 1200. Pseudo TCAM 1200 can include data entries 1202 with corresponding mask entry 1204. In the arrangement shown, a single mask entry 1204 (mask entry "Mask=A") can mask match operations for eight different data entries "Data=0" to "Data=7".

Among the numerous applications for memory systems using TCAM devices or TCAM systems are network search engines (NSEs). An NSE can use TCAMs to provide fast searches of a database, list, or pattern. A block diagram of a line card that includes an NSE having a conventional pseudo TCAM system is shown in FIG. 13 and designated by the general reference character 1300. Line card 1300 can include a network processing unit (NPU) and/or application specific integrated circuit (ASIC) 1302 and NSE 1304. Generally, a conventional NSE 1304 can include a control circuit 1306 or control logic for controlling operation of a pseudo TCAM system 1308.

Similarly, FIG. 14 illustrates another line card 1400 having an NSE 1404 with a conventional full TCAM system 1408.

Due to the differences in the number of mask entries versus corresponding data entries between a full TCAM and the pseudo TCAM, conventional approaches require that two completely different TCAM devices be designed and implemented. The disadvantages of such an approach can include longer product development time and increased cost due to the resource needs for each a unique instantiation of a full TCAM and a pseudo TCAM. As one very particular example, each pseudo TCAM having a mapping of 1:N for mask-to-data correspondence can require a new design and development for each different value of N.

Another disadvantage to the above conventional approaches can be verification. Each unique instantiation (full TCAM or each different "N" mapping of a pseudo TCAM) can require a verification test bench and test suite written to completely validate the design. This can increase product development time, resource requirements, and cost.

Accordingly, it would be desirable to arrive at some TCAM circuit and/or method that can address the above drawbacks of the conventional approaches noted above.

SUMMARY OF THE INVENTION

The present invention can provide a solution to the above and other problems, and offers further advantages over conventional ternary content addressable memory (TCAM) systems and methods of operating the same.

In one aspect, the present invention is directed to a circuit and method of implementing a pseudo TCAM using a full TCAM array. In general, the pseudo TCAM system has control logic for writing a mask value to a mask field of a memory location selected from among the multiple memory locations in a full TCAM array, and simultaneously writing the same mask value to mask fields of a predetermined number of memory locations in the array. The predetermined number of memory locations may or may not have row addresses sequentially adjacent to that of the selected memory location.

According to one aspect of the embodiments, a memory system can include a full ternary content addressable memory (TCAM) array with a plurality of individually addressed memory locations, each having an associated mask field for storing a mask value. In addition, a plurality row decoders can each activate a word line associated with one of the plurality of memory locations. An address modification circuit can be coupled to the row decoders. The address modification circuit can enable the writing of a same mask value to the mask fields of a plurality of memory locations, each having a unique row addresses. In such an arrangement, mask values can be written to multiple mask fields in a full TCAM array, thus enabling pseudo TCAM capabilities.

According to another aspect of the embodiments, an address modification circuit can be responsive to a write-to-mask command, and can write a mask value received on bit lines to the mask fields of the predetermined number of memory locations. In this way, a single command can write multiple mask values.

According to another aspect of the embodiments, each of the memory locations can further include a data field for storing a data value.

According to another aspect of the embodiments, a memory system can further include a control logic circuit for selecting at least one memory location from among the plurality of memory locations. In such an arrangement, a memory system can provide both pseudo TCAM and full TCAM capabilities.

According to another aspect of the embodiments, an address modification circuit can further include an enable/disable control circuit adapted to disable the address modification circuit in response to a first control signal received in the enable/disable circuit. In this way, a pseudo TCAM capability can be selectively disabled and enabled.

According to another aspect of the embodiments, an address modification circuit can further include a configuration circuit adapted to alter the predetermined number of locations to which the same mask value is written in response to at least a second control signal received in the configuration circuit. In this way, a memory system can provide selection from multiple pseudo TCAM capabilities (select from between multiple values of "N", for 1:N mapping).

According to another aspect of the embodiments, a predetermined number of memory locations can be eight memory locations.

According to another aspect of the embodiments, a memory system can also include the memory system being coupled to a network search engine. In this way, the advantageous features of the memory system can be utilized in a network search engine application.

The present invention can include a method of operating a memory system. Such a method can include receiving a unique address corresponding to a memory location, and in a pseudo-ternary mode, activating a predetermined number of N word lines, where N is an integer greater than 1. Activation of such word lines can write a mask value into mask fields of a plurality of memory locations of a full ternary CAM (TCAM) array. In this way, a method can provide pseudo TCAM capabilities with a full TCAM array.

According to another aspect of the embodiments, receiving a unique address can include coupling at least a portion of a unique row address to control logic of the memory system. In such an arrangement, the application of a unique address can result in the activation of multiple word lines.

According to another aspect of the embodiments, each memory location of the fully ternary CAM array can include a data field corresponding to each mask field. A data field can store data values for comparison with compare data.

According to another aspect of the embodiments, a method can further include receiving a mask value on bit lines associated with the plurality of memory locations. Thus, according to the method, a single received mask value can be written to multiple mask locations.

According to another aspect of the embodiments, a method can further include receiving a write-to-mask command in conjunction with the unique address.

According to another aspect of the embodiments, a method can further include in a full-ternary mode, activating a word line associated with the corresponding memory location to write a mask value only into a mask field in the corresponding memory location of a full ternary content addressable memory (CAM) array. In addition, the method can include enabling a full-ternary mode and disabling the pseudo-ternary mode in response to a mode signal having one value, and disabling the full-ternary mode and enabling the pseudo-ternary mode in response to a mode signal having another value. In this way, a system can be advantageously switched between modes (pseudo and full) to accommodate different applications as needed.

According to another aspect of the embodiments, a method can further include, in the pseudo-ternary mode, prior to activating the predetermined number of N word lines, specifying the value N. In this way, a mapping value N can be a selectable value. In one very particular arrangement, a value of N can be $2^m$, where m is an integer greater than zero.

The present invention can also include system having a TCAM array with a plurality of mask locations coupled to corresponding mask word lines and a row decoder coupled to each mask word line. Each row decoder can activate the associated mask word line in response to active address inputs values. The system can further include control logic coupled to the row decoders that generates active address input values for a plurality of decoders in response to a unique row address. In this way, multiple address decoders can be activated in response to a single address value.

According to another aspect of the embodiments, control logic can further include an address application circuit that logically combines a pseudo mode indication with a predetermined number of address bit values to generate a modified address value. In such an arrangement a received address value can be masked to thereby enable the activation of multiple row decoders.

According to another aspect of the embodiments, control logic can further include a decoder modifying circuit coupled to a corresponding one of the row decoder. Each decoder modifying circuit can alter a corresponding row decoder to be responsive to a logical combination of a row address and a pseudo mode value. In such an arrangement, multiple row decoders can be configured to respond to a same logical combination.

According to another aspect of the embodiments, decoder modifying circuits can be enabled in response to a pseudo-ternary mode indication and disabled in response to a full-ternary mode indication. In this way, a system can be switched between a full ternary mode and a pseudo-ternary mode to accommodate multiple applications with a same system.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed to a ternary content addressable memory (TCAM) system and method, having a full ternary CAM array and novel control logic for emulating a pseudo TCAM system.

Three basic types of operations can be performed on or using TCAM devices: read, write and compare (e.g., search). According to the embodiments of the present invention, read and compare operations can be no different than a conventional TCAM. However, according to the disclosed embodiments, write operations can be different from conventional approaches.

Generally, the embodiments of the invention can include a memory system having a full TCAM array that includes additional control logic, or equivalent structures, for controlling the writing of mask values to the full TCAM array.

A first embodiment of a TCAM device or system according to the present invention will now be described with reference to FIGS. 1 and 2.

Figure 1:
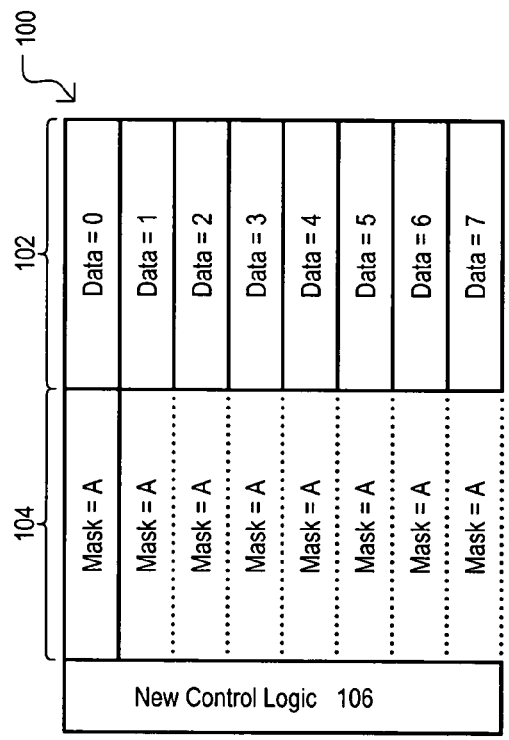
FIG. 1 is a block diagram of control logic and mask and data fields of a full ternary content addressable memory (TCAM) array operated as a pseudo TCAM according to an embodiment of the present invention.

FIG. 1 is a block diagram of a TCAM device having control logic, mask and data fields of a full TCAM array operated as a pseudo TCAM according to an embodiment of the present invention. This figure shows that with the present invention, a full TCAM device can act like a pseudo TCAM device.

Referring to FIG. 1, a TCAM system 100 can include a full TCAM array having a number of individually addressed memory locations, each with a data field 102 for storing a data value and an associated mask field 104 for storing a mask value. A TCAM system 100 can further include control logic 106 for selecting memory locations from among the number of memory locations to which the data and mask values are to be written. In contrast to a conventional full TCAM system, in the arrangement of FIG. 1, in a write-to-mask operation (or the like), writing to the address of any one of eight mask locations results in a write to all eight locations. It will be recalled that in a conventional full ternary case, a write-to-mask command writes data to only one row address (and hence one mask location) corresponding to a unique address.

As is well understood, a write-to-mask operation can be initiated according to a write-to-mask command. As is also well understood, a write-to-mask command can be a particular set of control bits and/or one or more bits included with write data applied to a device in conjunction with a general write command. Accordingly, a write-to-mask command should not necessarily be construed as being limited to any particular format.

In this way, a TCAM system 100 according to one embodiment can write a same mask value to multiple mask locations to thereby emulate a pseudo TCAM system.

As noted above, in accordance with embodiments of the present invention, control logic can be included with a circuit that simulates pseudo TCAM functionality with a full TCAM memory array. A more detailed example of such an arrangement is shown in FIG. 2.

Figure 2:
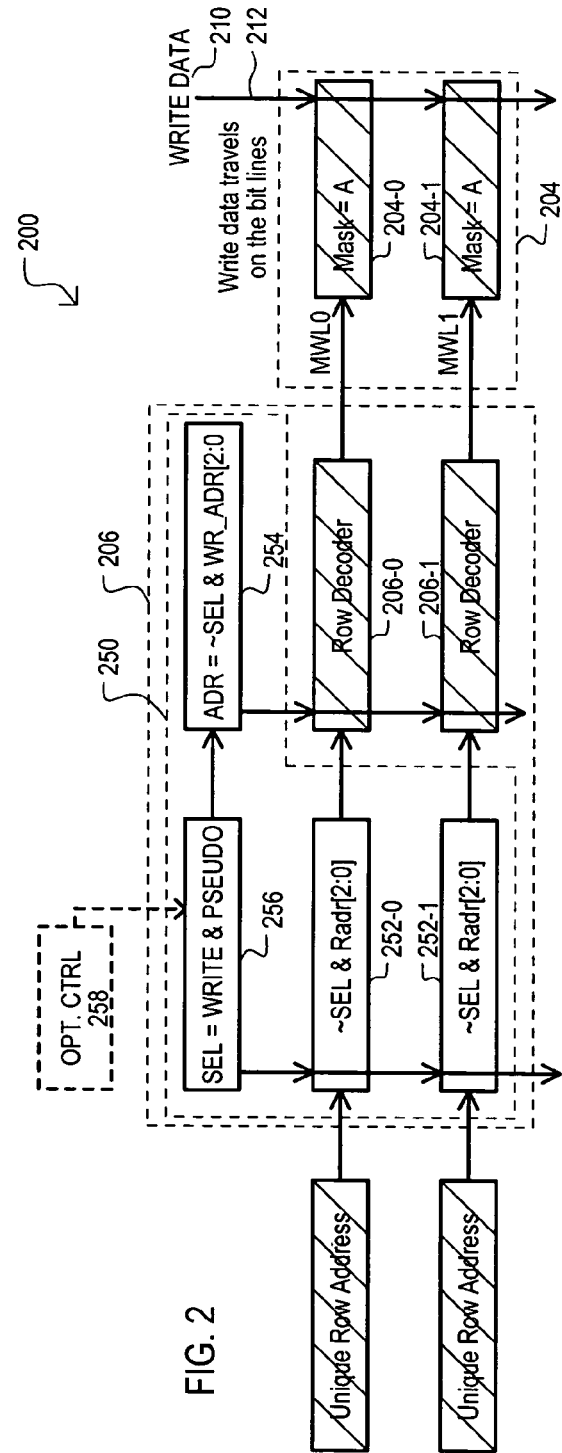
FIG. 2 is a detailed block diagram of control logic of a TCAM system according to an embodiment of the present invention.

FIG. 2 is a block diagram of a TCAM system 200 illustrating a write-to-mask operation according to an embodiment. FIG. 2 includes hatched features. In one arrangement, such hatched features can be the same as the conventional features shown in FIG. 11. Thus, like the conventional full TCAM arrangement of FIG. 11, the TCAM system 200 of FIG. 2 can include two mask locations 204-0 and 204-1 (corresponding data locations being excluded to avoid cluttering the view), as well as row decoders 206-0 and 206-1.

Figures 10, 11:
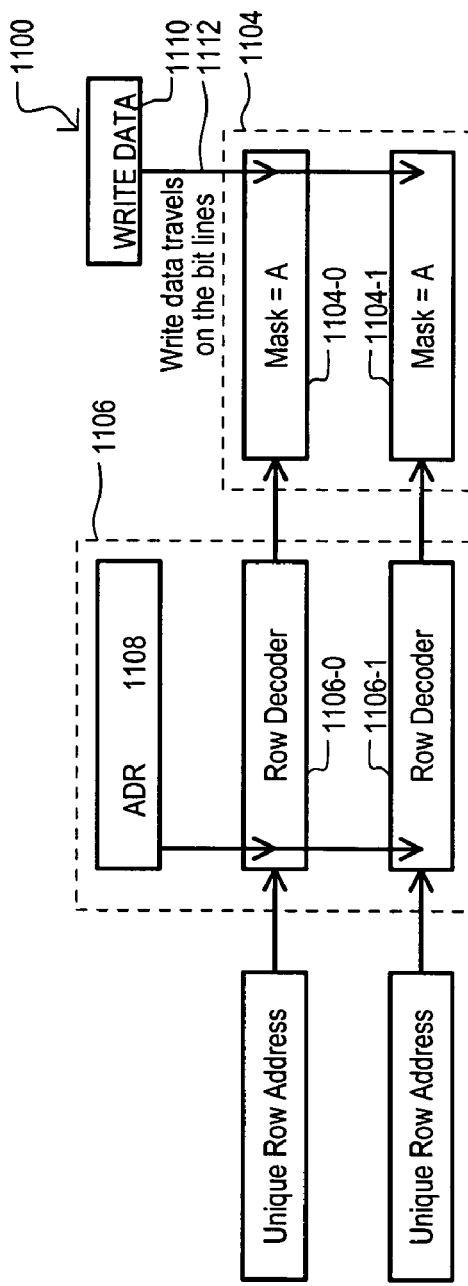
FIG. 10 is a block diagram of mask and data fields of a full TCAM array in a conventional TCAM system.
FIG. 11 is a detailed block diagram of control logic of a conventional full TCAM system.
Figure 13:
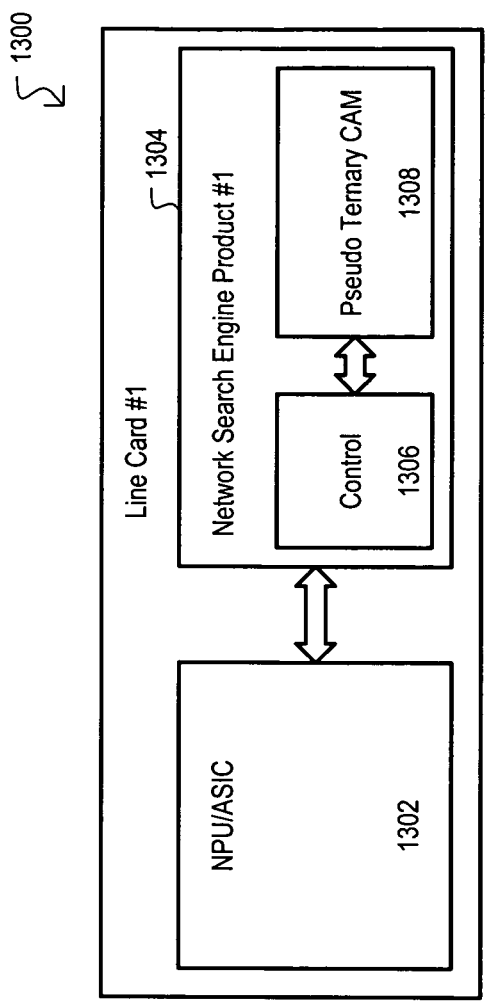
FIG. 13 is a block diagram of a line card including a Network Search Engine (NSE) using a conventional pseudo TCAM system.
Figure 14:
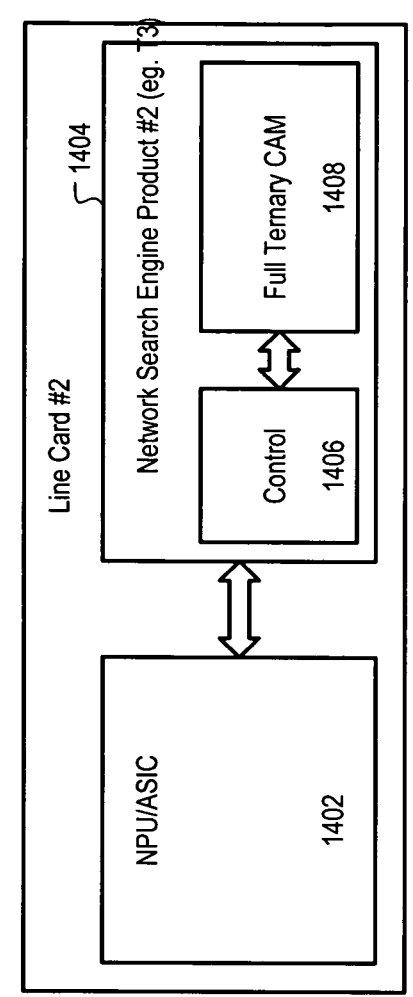
FIG. 14 is a block diagram of a line card including a Network Search Engine (NSE) using a conventional full TCAM system.
Figure 12:
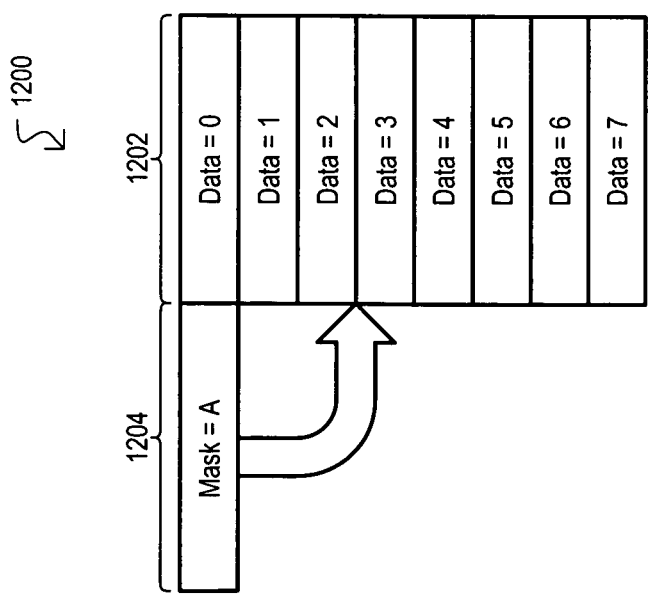
FIG. 12 is a block diagram of a mask and data fields of a pseudo TCAM array in a conventional TCAM system.

However, unlike the arrangement of FIG. 11, new control logic 206 for the mask locations (204-0 and 204-1) can include an address modification circuit 250 coupled between inputs for receiving unique row addresses and a number of corresponding row decoders (206-0 and 206-1). As will be described below, row decoders (206-0 and 206-1) can be responsive to a modified row address (shown as ~SEL & Radr[2:0]). As will also be described below, alternatively, such row decoders (206-0 and 206-1) can also be responsive to unique row addresses.

In the very particular arrangement of FIG. 2, in response to a write-to-mask command, address modification circuit 250 can write a mask value 210 received on bit lines 212 associated with a selected memory location, into a mask field of such selected a memory location, and simultaneously to mask fields of a predetermined number of other memory locations having unique row addresses different from that of the selected memory location.

While such a predetermined number of memory locations may have row addresses sequentially adjacent to one another. Such an arrangement should not be construed as limiting the invention thereto. Alternate embodiments can include row addresses that are not sequentially adjacent to that of the selected memory location.

Referring still to FIG. 2, each mask entry (e.g., location) (204-0 and 204-1) in the full TCAM memory array can have a word line (shown as MWL0 and MWL1), that when active, causes external write data 210 to be written into a mask entry (204-0 and 204-1) by way of shared bit lines 212.

Each mask entry (204-0 and 204-1) can have a hard coded address that uniquely identifies the mask location for read and write operations (represented in the figure by "Unique Row Address"). An address modification circuit 250, when active, can force several (N) mask locations to operate as if such mask locations had the same row address, thereby producing 1:N mapping. Thus, when an external address is applied and compared against each mask entry row address, an address modification circuit 250 can cause several word lines to go active, thus multiple mask entries will be updated with the same external write data 210.

In the particular implementation of FIG. 2, in a read operation, an external address supplied can be any of the mask row addresses for those mask entries clustered together in the 1:N mapping. It is understood that a correct value will always be read if all mask entries store the same mask value (e.g., Mask=A).

In a compare/search operation, because each mask entry contains the same value, the full TCAM memory array can operate in the same general fashion as pseudo TCAM device, as one mask value is applied to all data entries of the "N" group of entries.

In a mask write operation, an external address can be provided that corresponds to only one of the mask entries in a 1:N mapping cluster. This can be a problem with conventional arrangements seeking to implement pseudo TCAM functionality with a full TCAM array. The embodiments can solve such a problem by causing all word lines corresponding to the N mask entries to go active. Thus, no matter which address within the cluster of mask entries is applied, all mask entries of the cluster can be updated with the same mask value. In this manner, a full TCAM memory array can act like a pseudo TCAM.

In the very particular example of FIG. 2, address modification circuit 250 can include decoder modifier circuits 252-0 and 252-1 and address modifier circuit 254. As shown, decoder modifier circuits (252-0 and 252-1) can alter row decoder operation, so that row decoders (206-0 and 206-1) can be responsive to a masked address value. The particular example assumes that pseudo TCAM operates with a 1:8 mapping of mask to data values. To achieve such a mapping, row decoders (206-0 and 206-1) can be configured to operate in response to the last three bits of a row address being masked. This is represented in FIG. 2 by "~SEL & Radr[2:0]". As but one very particular example, this can represent a functionality in which a row decoder (206-0 and 206-1) is activated in response to a row address that includes higher order bits [m:3] and the last three bits of least significance being the same value (e.g., "000" a logical ANDing of a bit complement of an active select value SEL). An alternate embodiment, to make the last three bits of least significance being the same value, is represented by "~SEL|Radr[2:0]" (e.g., "111" a logical ORing of a bit complement of an active select value SEL).

In addition, an address modifier circuit 254 can generate a modified address having the lower significance bits corresponding to an "N" grouping masked. Thus, when an address modifier circuit 254 is active, an applied address ADR can have the last three bits of least significance masked. This is represented in FIG. 2 by "ADR=~SEL & WR_ADR[2:0]". As but one very particular example, this can represent a functionality in which a mask write address WR_ADR[m:0] has a last three bits set to the same value (e.g., "000" a logical ANDing of a bit complement of an active select value SEL). An alternate embodiment, to make the last three bits of least significance being the same value, is represented by "~SEL|WR_ADR[2:0]" (e.g., "111" a logical ORing of a bit complement of an active select value SEL).

FIG. 2 also shows a select signal generator 256. In the very particular example shown, a select signal SEL can be activated when a write indication WRITE and pseudo ternary mode indication PSEUDO are both active. This is represented in FIG. 2 by "SEL=WRITE & PSEUDO".

In the embodiments described above, an address modification circuit 250 can always be enabled. That is, a memory system with a full TCAM array can be implemented or configured such that it always functions in the same essential manner as a 1:N pseudo TCAM.

Alternatively, an address modification circuit 250 can further include an optional enable/disable control circuit 258, as shown in FIG. 2. Enable/disable control circuit 258 can disable a circuit in response to a control signal, to thereby enable a user to select a mode of operation (pseudo or full) for a TCAM system 200. In one very particular arrangement, an enable/disable control circuit 252 can provide an optional configuration bit through a number of ways, including but not limited to a register and/or an input pin, by which the pseudo ternary CAM mode can be set.

The implementation shown in FIG. 2 and described above can be logically described as follows:

$$MaskWordLine = (Radr[x] \& \sim SEL) == (Adr[x] \& \sim SEL);$$

where MaskWordLine represents the state of a mask word line (e.g., MWL0 or MWL1), Radr[x] is a bit of the address of a row, Adr[x] is an address bit, and ~SEL is control value for a pseudo TCAM mode.

The above equation can be applied to all bits that make up a 1:N cluster. For example, if the mapping is 1:8, then only bits [2:0] of the address would require these equations. If the mapping is 1:16 then only bits [3:0] of the address would require these equations, etcetera. As an example, a 1:4 mapping would generate the following equation:

$$MaskWordLine = ((Radr[0] \& \sim SEL) == (Adr[0] \& \sim SEL))$$

$$|((Radr[1] \& \sim SEL) == (Adr[1] \& \sim SEL))$$

$$|(Radr[2] == Adr[2])$$

. . .

$$|(Radr[m] == Adr[m]);$$

Figure 3:
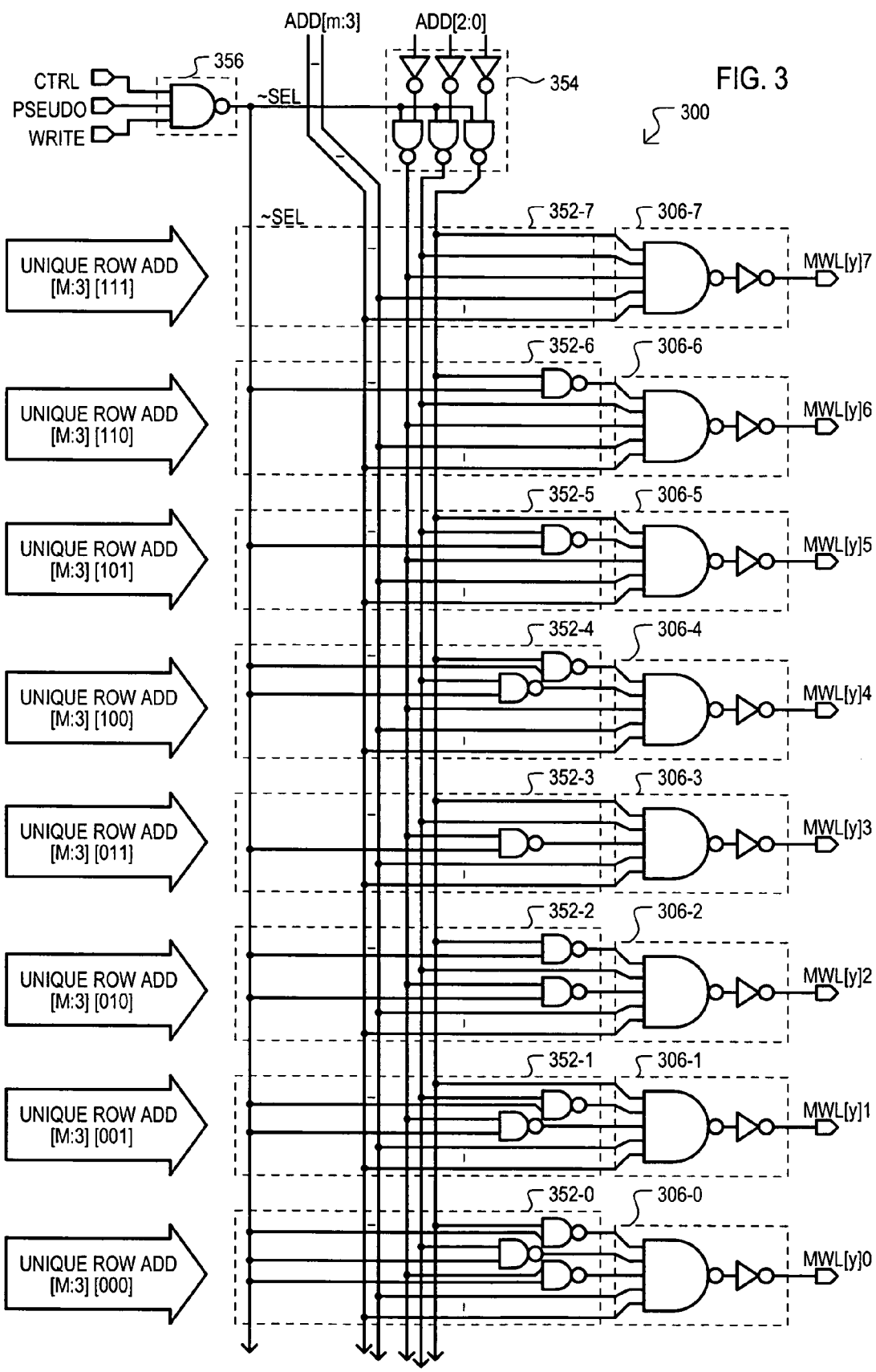
FIG. 3 is schematic diagram of control logic of a TCAM system according to an embodiment of the present invention.

Another very particular embodiment following the same general logic approach above is shown in FIG. 3 and designated by the general reference character 300. FIG. 3 can be conceptualized as being one of many possible variations of the approach shown in FIG. 2, and thus shows some of the same general components as FIG. 2, including row decoders 306-0 to 306-7, decoder modification circuits 352-0 to 352-7, address modifier circuit 354, and a select signal generator 356.

Row decoders (306-0 to 306-7) can generate mask word line signals MWL[y] to MWL[y]7. It is understood that the term "[y]" can indicate a higher order grouping of word lines. Decoder modification circuits (352-0 to 352-7) can alter input signals applied to row decoders (306-0 to 306-7), so that row decoders (306-0 to 306-7) can activate respective word line signals (MWL[y] to MWL[y]7) in response to either a unique address or a masked address.

In the particular implementation shown, when select signal ~SEL is inactive (high in this example), row decoders (306-0 to 306-7) can respond to unique address values (UNIQUE ROW ADD) as indicated in the figures. Such an address includes address bits m:0, where the last three binary digits vary. In addition, address modifier circuit 354 can be disabled, allowing address bits [2:0] to be transmitted unchanged (e.g., not masked). Thus, the embodiment 300 can operate in a full ternary fashion.

However, when ~SEL is active (low in this example), each row decoder (306-0 to 306-7) can respond to the address [m:3][111] (last three binary digits masked). In addition, address modifier circuit 354 can be enabled, masking address bits [2:0] by forcing such bits to [111]. Thus, the embodiment 300 can operate in a pseudo ternary fashion, activating all word lines, regardless of the last three digits (assuming bits m:3 match).

Of course, the embodiment of FIG. 3 is but one implementation of the general approach shown in FIG. 2, and should not be construed as limiting to the invention. That is, the embodiments of the present invention can be implemented in various alternate ways.

Figure 4:
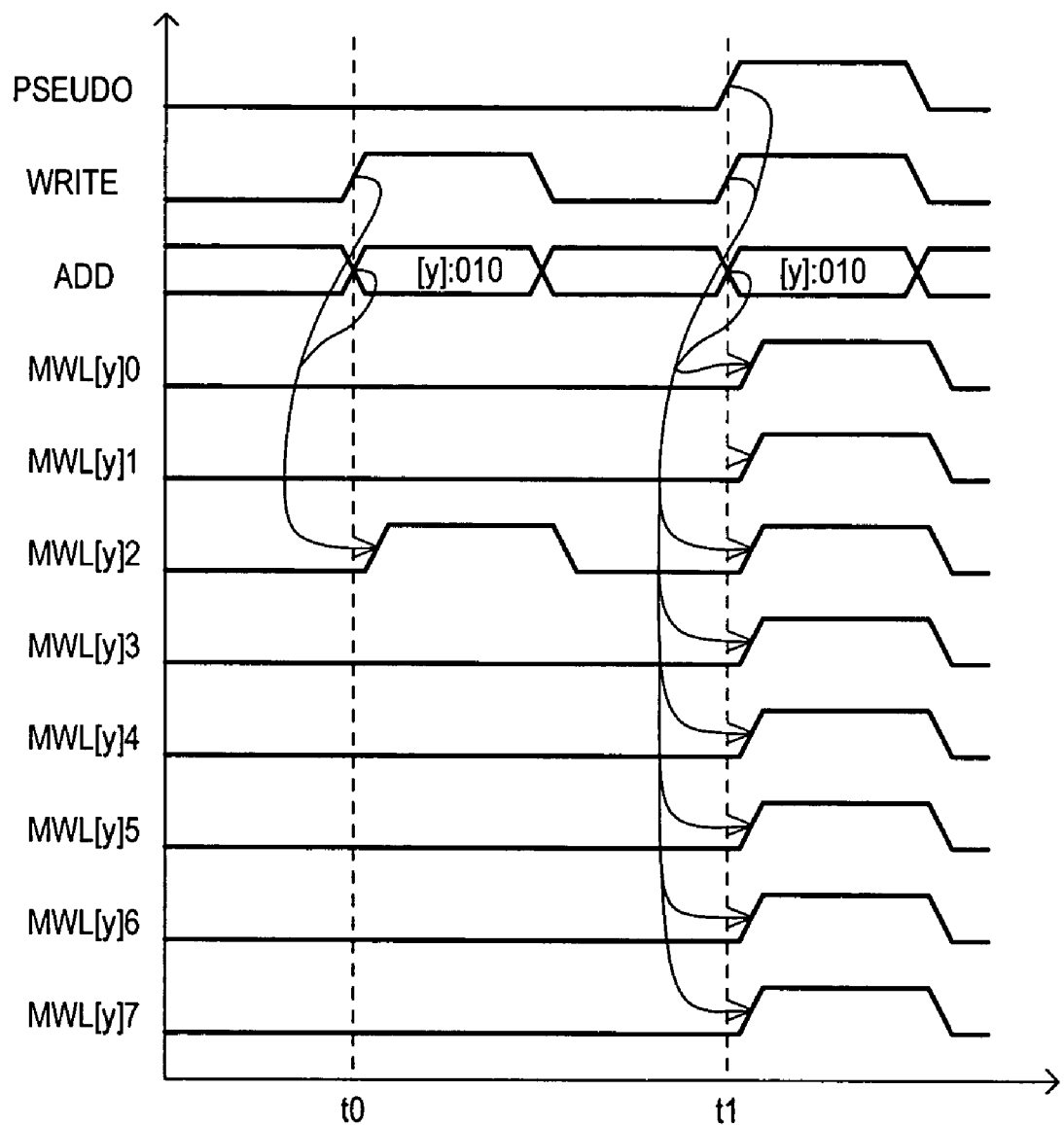
FIG. 4 is a timing diagram showing the operation of a TCAM system of FIG. 2 and/or 3.

Referring now to FIG. 4, a timing diagram shows the operation of a TCAM according to the embodiments of FIGS. 2 and/or 3. FIG. 4 shows waveforms for a pseudo ternary mode indication PSEUDO, write operation indication WRITE, write address ADD, and corresponding word lines MWL[y] to MWL[y]7.

At time t0, a mask write operation can be initiated to address [y]:[010] (where y can be higher order bits, and 010 can be the binary value for bits 2:0). At this time, the value PSEUDO is inactive (low in this case), thus the circuit operates in a full ternary fashion, and only one unique word line MWL[y]2 is activated.

At time t1, a mask write operation can be initiated to the same address [y]:[010]. However, at this time the value PSEUDO is active. As a result, the circuit operates in a pseudo ternary fashion, and word lines MWL0 to MWL7 are activated together.

Other embodiments of the present invention can be implemented in various alternate ways. As noted above, the implementations shown in FIGS. 2 and 3, and described above can be logically described in general as: MaskWordLine=(Radr[x] & ~SEL)==(Adr[x] & ~SEL).

However, one of the many possible alternate embodiments could include:

MaskWordLine=(Radr[x]==Adr[x])|~SEL where MaskWordLine represents the state of a mask word line, Radr[x] is a bit of the address of a row, Adr[x] is an address bit, and ~SEL is mask value for a pseudo TCAM mode.

As in the other logical relationship noted previously, the above equation can be applied to all bits that make up a 1:N cluster.

Figure 5:
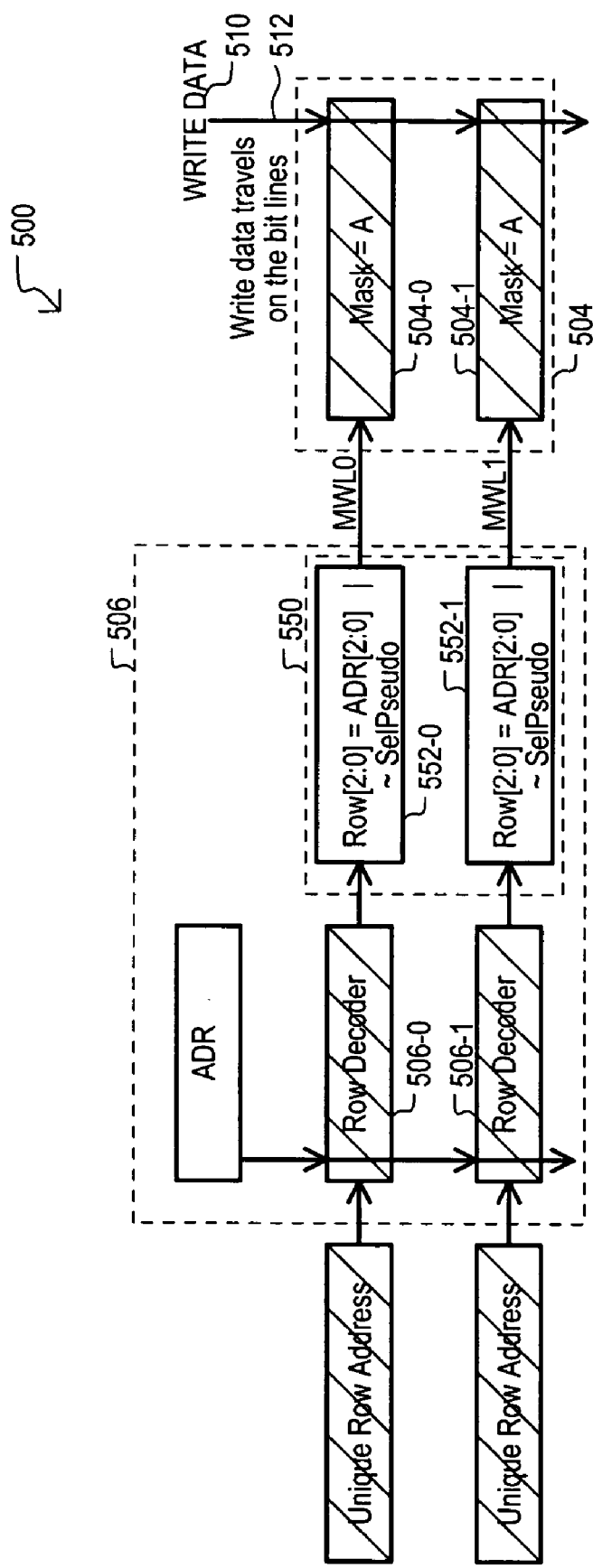
FIG. 5 is a detailed block diagram of control logic of a TCAM system according to another embodiment of the present invention.

FIG. 5 is a block diagram of a TCAM system 500 illustrating a write-to-mask operation according to one such embodiment. In the arrangement of FIG. 5, new control logic 506 for the mask locations (504-0 and 504-1) can include an address modification circuit 550 that can be coupled between row decoders (506-0 and 506-1) and word lines MWL0 and MWL1. Row decoders (506-0 and 506-1) can be responsive to unique addresses.

As in the case of the embodiment of FIG. 2, each mask entry (504-0 and 504-1) can have a hard coded address that uniquely identifies the mask location for read and write operations. An address modification circuit 550, when active, can force several (N) mask locations to operate as if such mask locations had the same row address, thereby producing 1:N mapping.

Referring still to FIG. 5, in a mask write operation, an external address can be provided that corresponds to only one of the mask entries in a 1:N mapping cluster. Address modification circuit 550 can include decoder modifier circuits 552-0 and 552-1. Decoder modifier circuits (552-0 and 552-1) can alter row decoder operation, so that row decoders (506-0 and 506-1) can be responsive to a select signal ~SelPseudo. This is represented in FIG. 5 by "Row[x]= ADR[x]|~SelPseudo". It is understood that a signal ~SelPseudo can be unique to each 1:N mapping cluster.

Figure 6:
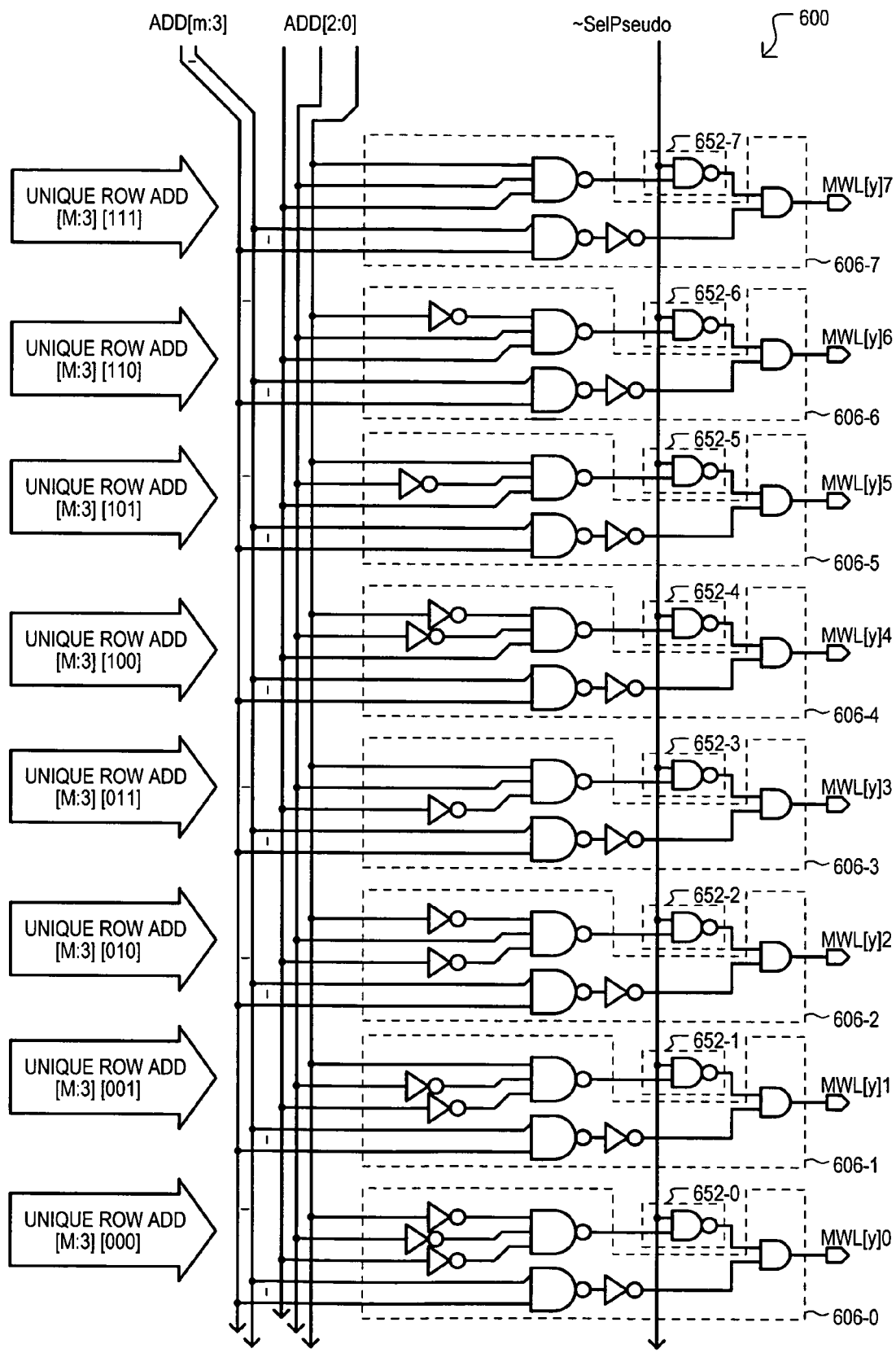
FIG. 6 is schematic diagram of control logic of a TCAM system according to another embodiment of the present invention.

Another very particular embodiment following the same general logic approach of FIG. 5 is shown in FIG. 6 and designated by the general reference character 600. FIG. 6 can be conceptualized as being one of many possible variations of the approach shown in FIG. 5, and thus shows some of the same general components as FIG. 5, including row decoders 606-0 to 606-7 and decoder modification circuits 652-0 to 652-7.

Decoder modification circuits (652-0 to 652-7) can force word lines signals MWL0 to MWL7 high, regardless of the address values. Thus, word lines are activated according to logical ORing of a decoded address or an active select signal ~SelPseudo.

In the particular implementation shown, when select signal ~SelPseudo is inactive (high in this example), outputs from row decoders (606-0 to 606-7) can respond to unique address values as indicated in the figures. Thus, the embodiment 600 can operate in a full ternary fashion.

However, when signal ~SelPseudo is active (low in this example), decoded outputs of lower significant bits ADD[2:0] can be logically combined with signal SelPseudo, essentially forcing all eight match word lines (MWL0 to MWL7) high. Again, it is understood that signal ~SelPseudo can be unique to each 1:N cluster (in this case, N=8). As but one example, each ~SelPseudo signal can be generated by decoding higher order address bits ADD[m:3].

Of course, the embodiment of FIG. 6 is but one implementation of the general approach shown in FIG. 5, and should not be construed as limiting to the invention.

In yet another alternative embodiment, a TCAM can further include a configuration circuit for altering the predetermined number of locations to which the same mask value is written in response to another control signal. That is, a user can configure the mapping as 1:4, 1:8, 1:16 etcetera.

Figure 7:
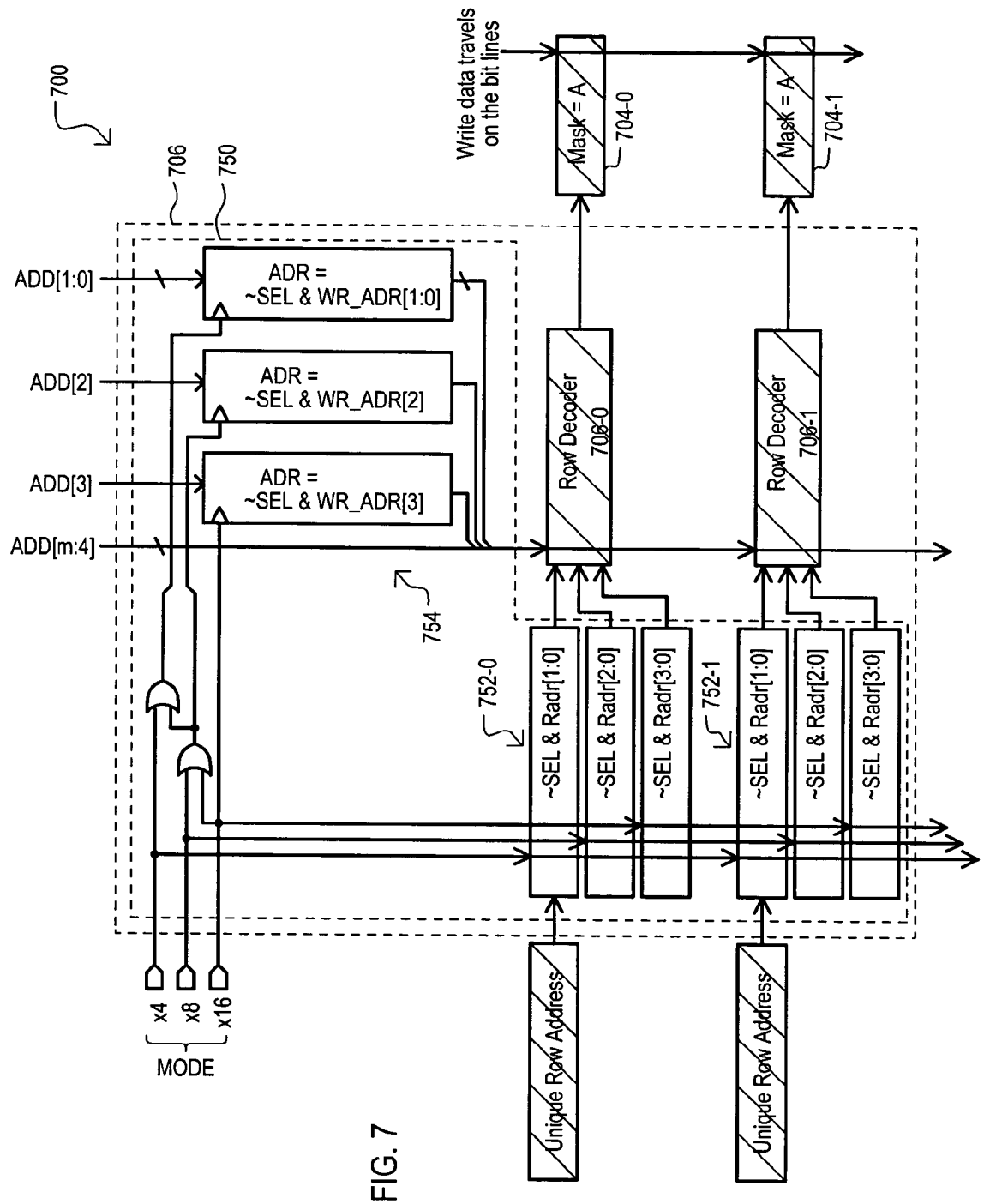
FIG. 7 is a detailed block diagram of control logic of a TCAM system according to another embodiment of the present invention.

One example of the many possible approaches to configuring mapping for selectable pseudo ternary operation is shown in FIG. 7, and designated by the general reference character 700. The embodiment of FIG. 7 includes decoder modification circuits 752-0 and 752-1. Each decoder modification circuit (752-0 and 752-1) can alter a corresponding decoder operation according to mode select signals x4, x8 and x16. That is, if mode select signal x4 is active, row decoders (706-0 and 706-1) can activate their respective word lines MWL0 and MWL1 as if the last two digits of an addressed were masked (~SEL & Radr[1:0]). Decoder modification circuits (752-0 and 752-1) can provide for larger 1:N mapping by causing decoder to operate as if larger numbers of address bits are masked.

Similarly, an address modifier 754 can modify a received address, by masking larger numbers of address bits according to a selected mapping arrangement.

Of course FIG. 7 shows but one way of providing user configurable mapping, and should not be construed as limiting to the invention. As but one example, such user configurability could be implemented using the logical arrangement represented by FIG. 4.

Figure 8:
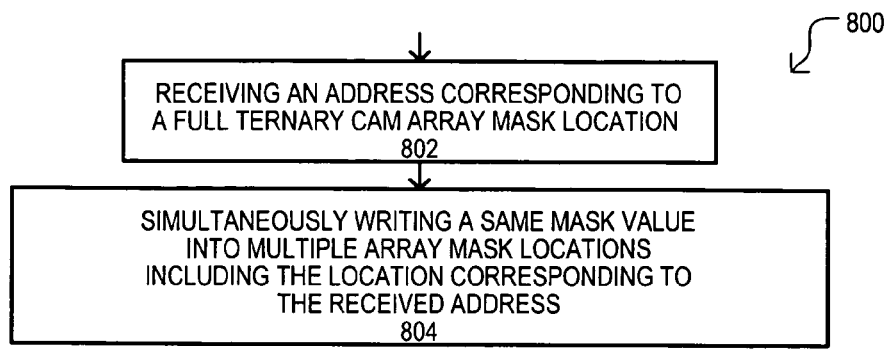
FIG. 8 is a flow diagram of a method according to an embodiment of the present invention.

A method according to one embodiment is set forth in FIG. 8, and designated by the general reference character 800. A method 800 can include receiving an address corresponding to a full ternary CAM array mask location (802). In one particular approach, such a step can include receiving a multi-bit row address value.

A method 800 can further include simultaneously writing a same mask value into multiple array mask locations. Such locations can include the location corresponding to the received address (804). In one particular arrangement, such a step can include activating multiple word lines, essentially simultaneously, to write data on bit lines into mask locations accessed by the word lines.

In this way, a full ternary CAM array can function in the same general fashion as a pseudo CAM array.

Figure 9:
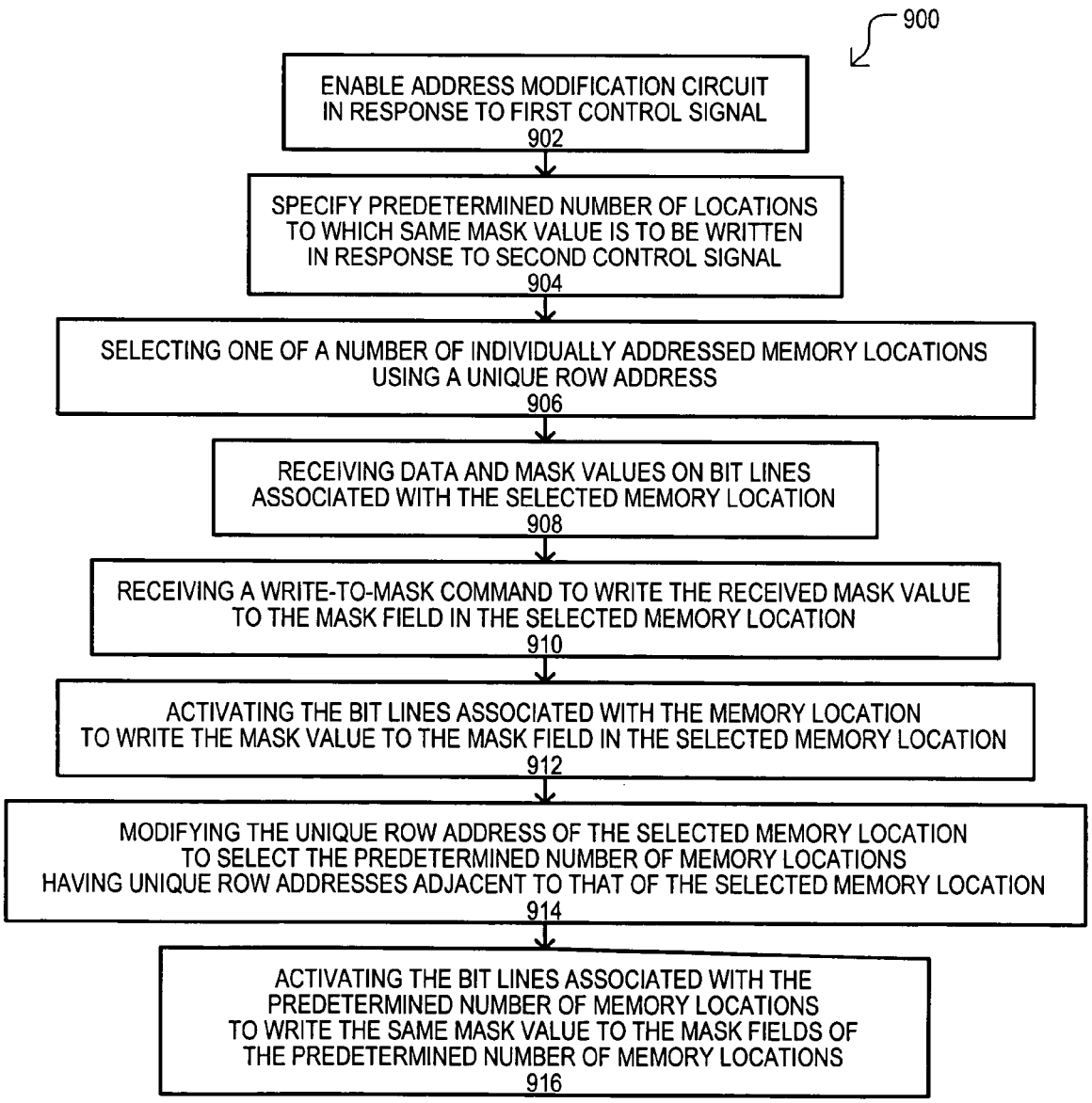
FIG. 9 is a flowchart showing another method according to an embodiment of the present invention.

Yet another embodiment of a method or process for operating a TCAM system having a full TCAM array will now be described with reference to FIG. 9. FIG. 9 is a flowchart of a method for operating a TCAM system having a full TCAM array as a pseudo TCAM system according to an embodiment of the present invention. The method is designated by the general reference character 900.

Optionally, a method 900 can begin with an initial step of enabling an address modification circuit in response to a first control signal (902). As but one example, such a step can be executed by a user. Even more particularly, a user can apply an external control signal, or configure a TCAM device/system according to some option, such as a bonding option, as but one example.

A method 900 can also include, optionally, specifying a predetermined number of locations to which a same mask value is to be written by issuing a second control signal to the configuration circuit (904). Again, such step can be initiated by an external signal or option. Of course, in other embodiments, such a step can be omitted and a TCAM can be pre-configured (e.g., hard wired) to provide a preset mapping number.

A method 900 can further include selecting one of a number of individually addressed memory locations using a unique row address (906). In addition, data and mask values can be received on bit lines associated with the selected memory location (908). Of course, such a step could also include receiving only a mask value on the bit lines.

A writing of mask values to multiple mask locations can occur in response to a predetermined event. In the method of FIG. 9, this can include receiving a write-to-mask command to write the received mask value to the mask field in the selected memory location (910).

The particular method 900 also includes activating the word line associated with the memory location to write the mask value to the mask field in the selected memory location (912).

The method 900 can also write the mask value into one or more additional mask locations. In the particular arrangement shown, this can include modifying the unique row address of the selected memory location to select the predetermined number of memory locations. Further, in the example shown, although not limiting to the invention, such memory locations can be adjacent to the selected memory location (914).

Word lines can then be activated to write the same mask value into mask fields of the predetermined number of memory locations. Such word lines are associated with the predetermined number of memory locations (916).

It will be appreciated that the steps of the method shown in FIG. 9 need not be in the sequence shown, and some steps may occur essentially simultaneously with others. As but one of the many possible variations, steps 912 and 916 can be executed essentially simultaneously.

It is also understood that the embodiments of the invention may be practiced in the absence of an element and or step not specifically disclosed. That is, an inventive feature of the invention can be elimination of an element.

Thus, the foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A memory system comprising:
a plurality row decoders logically divided into row decoder groups, each row decoder corresponding to a different mask field of a full ternary content addressable memory (TCAM) array, each mask field having a unique row address; and
an address modification circuit coupled to each row decoder group, each address modification circuit having
a first mode that enables the writing of a same mask value simultaneously to the corresponding mask fields of a plurality of row decoders of the group in response to any of the unique addresses of the corresponding mask fields of the group, and
a second mode that enables the writing of one mask value to one corresponding mask field in response to the unique address of the one mask field; wherein
each row decoder has inputs coupled to the address modification circuit corresponding to its row decoder group, and an output coupled to a corresponding word line.

2. The memory system of claim 1, wherein:
each address modification circuit is placed into the first mode in response to a write-to-mask command.

3. The memory system of claim 1, wherein:
each mask field forms part of a memory location that further includes a data field for storing a data value.

4. The memory system of claim 1, wherein:
each address modification circuit further includes a configuration circuit adapted to alter the number of mask fields to which the same mask value is written in the first mode in response to at least a second control signal received in the configuration circuit.

5. The memory system of claim 1, further including:
the number of mask fields is eight.

6. The memory system of claim 1, further including:
the memory system is coupled to a network search engine.

7. A method of operating a memory system, comprising the steps of:
receiving a unique address corresponding to a memory location;
in a pseudo-ternary mode, modifying at least a portion of the unique address to activate a predetermined number of N word lines, where N is an integer greater than 1, to write a mask value simultaneously into mask fields of a plurality of memory locations of a full ternary CAM array, the memory locations having different addresses and one of the memory locations having the unique address; and
in a full ternary mode, activating one word line to write one mask value into the mask field of the memory location of the full ternary CAM array that has the unique address.

8. The method of claim 7, wherein:
receiving a unique address includes coupling at least a portion of a unique row address to control logic of the memory system.

9. The method of claim 7, wherein:
each memory location of the fully ternary CAM array includes a data field corresponding to each mask field, the data field storing data values for comparison with compare data.

10. The method of claim 7, further including:
receiving the mask value on bit lines associated with the plurality of memory locations.

11. The method of claim 7, further including:
receiving a write-to-mask command in conjunction with the unique address.

12. The method of claim 7, further including:
in the pseudo-ternary mode, prior to activating the predetermined number of N word lines, specifying the value N.

13. The method of claim 12, wherein:
the value of $N=2^m$, where m is greater than zero.

14. A system, comprising:
a ternary content addressable memory (CAM) array having a plurality of mask locations each coupled to a corresponding mask word line;
a row decoder coupled to each mask word line, each row decoder having decoder inputs coupled to receive address values and a decoder output; and
control logic coupled to the row decoders that enables either multiple mask word lines or one mask word line to be driven to an active level in response to a unique address and includes an address modifier circuit that receives address values and modifies the address values applied to the decoder inputs of the row decoders in response to a pseudo ternary mode signal having a first value, and applies unmodified address values to the decoder inputs of the row decoders in response to the pseudo ternary mode signal having a second value.

15. The system of claim 14, wherein:
each row decoder is coupled to a same set of address lines: and
the address modifier circuit drives a predetermined number of the address lines to predetermined values regardless of the received address values in response to the pseudo ternary mode signal having the first value.

16. The system of claim 14, wherein:
the control logic further includes
a decoder modification circuit corresponding to each row decoder, each decoder modification circuit having at least a first modifier input coupled the decoder output of the corresponding row decoder and an output coupled to one of the mask word lines, a second modifier input of a plurality of decoder modification circuits being commonly coupled to a same pseudo select mode line.

17. The system of claim 16, wherein:
the address values received by each row decoder include less significant bits (LSBs) of an address and more significant bits (MSBs) of the address; and
the pseudo select mode line receives a signal generated by decoding the MSBs of the address.

* * * * *